(12) United States Patent
Ishikawa et al.

(10) Patent No.: US 10,950,452 B2
(45) Date of Patent: Mar. 16, 2021

(54) SEASONING METHOD AND ETCHING METHOD

(71) Applicant: Tokyo Electron Limited, Tokyo (JP)

(72) Inventors: Yoshio Ishikawa, Miyagi (JP); Takashi Enomoto, Miyagi (JP); Yutaka Osada, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/246,706

(22) Filed: Aug. 25, 2016

(65) Prior Publication Data

US 2017/0062227 A1    Mar. 2, 2017

(30) Foreign Application Priority Data

Aug. 26, 2015  (JP) .............................. JP2015-167035

(51) Int. Cl.
*H01J 37/32* (2006.01)
*H01L 21/3065* (2006.01)

(52) U.S. Cl.
CPC .... *H01L 21/3065* (2013.01); *H01J 37/32009* (2013.01); *H01J 37/3244* (2013.01); *H01J 2237/334* (2013.01)

(58) Field of Classification Search
CPC ............ H01L 21/3065; H01J 37/32009; H01J 37/3244
See application file for complete search history.

(56) References Cited

U.S. PATENT DOCUMENTS

| | | | | |
|---|---|---|---|---|
| 5,824,375 A | * | 10/1998 | Gupta | .................. B08B 7/0035 427/569 |
| 5,854,096 A | * | 12/1998 | Ohtani | ................ H01L 21/2026 438/166 |
| 6,699,398 B1 | * | 3/2004 | Kim | ........................ G21F 9/004 216/55 |
| 2006/0019031 A1 | * | 1/2006 | Furuta | ................. C23C 16/0209 427/248.1 |
| 2006/0057804 A1 | * | 3/2006 | Saito | .................... H01L 21/3065 438/254 |
| 2006/0100825 A1 | * | 5/2006 | Furuya | .............. H01L 21/67288 702/185 |
| 2007/0126150 A1 | * | 6/2007 | GanapathiSubramanian ............. B29C 33/444 264/319 |
| 2007/0238199 A1 | * | 10/2007 | Yamashita | ................ B08B 7/00 438/5 |

(Continued)

FOREIGN PATENT DOCUMENTS

JP    2003-197605 A    7/2003
JP    2015-012141 A    1/2015

*Primary Examiner* — Thomas T Pham
(74) *Attorney, Agent, or Firm* — Pearne & Gordon LLP

(57) ABSTRACT

A time required to return an inside of the chamber after performing maintenance of the inside of the chamber into a state prior to the maintenance can be shortened. A seasoning method includes a first dry cleaning process of cleaning the inside of the chamber by supplying an $O_2$ gas into the chamber and generating plasma of the $O_2$ gas within the chamber; and a second dry cleaning process of seasoning, after the first dry cleaning process, the inside of the chamber by supplying a processing gas containing fluorine into the chamber and generating plasma of the processing gas within the chamber.

10 Claims, 14 Drawing Sheets

(56) References Cited

U.S. PATENT DOCUMENTS

| | | | |
|---|---|---|---|
| 2008/0169499 A1* | 7/2008 | Kiyotoshi | H01L 27/105 |
| | | | 257/316 |
| 2015/0294838 A1* | 10/2015 | Kirkpatrick | H01J 37/3171 |
| | | | 250/251 |
| 2015/0376797 A1* | 12/2015 | Chen | C23F 1/02 |
| | | | 216/13 |
| 2016/0284555 A1* | 9/2016 | Bae | H01L 21/31144 |

* cited by examiner

SEASONING METHOD AND ETCHING METHOD

CROSS-REFERENCE TO RELATED APPLICATION

This application claims the benefit of Japanese Patent Application No. 2015-167035 filed on Aug. 26, 2015, the entire disclosures of which are incorporated herein by reference.

TECHNICAL FIELD

The embodiments described herein pertain generally to a seasoning method and an etching method.

BACKGROUND

In a process of forming an electrode wiring of a semiconductor device, various metal thin films are etched by plasma of a processing gas, which is generated within a chamber. In this etching process, a part of a reaction product (deposit) generated through a reaction between an element contained in the processing gas and an element contained in an etching target film adheres to an inner wall of the chamber or the like. If the amount of the deposit adhering to the inner wall of the chamber or the like increases, the deposit peeled off from the inner wall of the chamber or the like may float within the chamber and fall down. If the floating deposit within the chamber adheres to the semiconductor device (wafer), it may cause a defect of the semiconductor device having a wiring formed thereon.

To avoid this problem, Patent Document 1, for example, discloses a technique of cleaning the inside of the chamber with plasma of an $O_2$ gas whenever the etching process is performed for a preset time. If, however, the deposit on the inner wall of the chamber or the like cannot be completely removed through this cleaning process with the plasma, the deposit needs to be removed by performing maintenance such as cleaning the inside of the chamber mechanically after breaking a vacuum of the chamber.

Patent Document 1: Japanese Patent Laid-open Publication No. 2003-197605

However, in the mass production process, if the maintenance of the inside of the chamber is performed after breaking the vacuum of the chamber and if the inside of the chamber is then returned back into the vacuum, the environment within the chamber is already changed from the state (wafer processing atmosphere) as it was before the maintenance is performed. For this reason, after the maintenance of the inside of the chamber is conducted after breaking the vacuum of the chamber, a process, which is called "seasoning", is performed to return the environment within the chamber into the state prior to the maintenance before the mass production process is resumed.

In the conventional seasoning process, the environment within the chamber is returned back into the state prior to the maintenance by performing a process for a long time, e.g., by processing 250 sheets of wafers under the processing conditions where the mass production process is performed. Further, in the conventional seasoning process, the process corresponding to the mass production process needs to be performed for 10 hours or more in order to return the environment within the chamber into the state prior to the maintenance. Accordingly, it has been difficult to improve a throughput (operating rate) in the manufacturing process of the semiconductor device.

SUMMARY

According to an exemplary embodiment, a seasoning method includes a first process and a second process. In the first process, an inside of a chamber is cleaned by supplying an $O_2$ gas into the chamber and generating plasma of the $O_2$ gas within the chamber. In the second process, after the first process, the inside of the chamber is seasoned by supplying a processing gas containing fluorine into the chamber and generating plasma of the processing gas within the chamber.

In one exemplary embodiment, a seasoning method includes a first process of cleaning an inside of a chamber by supplying an $O_2$ gas into the chamber and generating plasma of the $O_2$ gas within the chamber; and a second process of seasoning, after the first process, the inside of the chamber by supplying a processing gas containing fluorine into the chamber and generating plasma of the processing gas within the chamber.

A time period during which the plasma of the $O_2$ gas is generated within the chamber in the first process may be longer than a time period during which the plasma of the processing gas is generated within the chamber in the second process.

The time period during which the plasma of the $O_2$ gas is generated within the chamber in the first process may be equal to or longer than 30 minutes.

The first process may include a third process of supplying the $O_2$ gas into the chamber; a fourth process of generating the plasma of the $O_2$ gas supplied into the chamber; and a fifth process of exhausting the $O_2$ gas from the chamber. Further, the third process to the fifth process may be repeated two or more times in the first process.

The processing gas may contain at least one of a CF-based gas, a NF-based gas and a SF-based gas.

The processing gas may contain at least one of a $CF_4$ gas, a $C_4F_6$ gas, a $NF_3$ gas and a $SF_6$ gas.

The second process may include a sixth process of supplying the processing gas into the chamber; a seventh process of generating the plasma of the processing gas within the chamber; and an eighth process of exhausting the processing gas from the chamber. Further, the sixth process to the eighth process may be repeated two or more times in the second process.

In another exemplary embodiment, an etching method includes a seasoning process of seasoning an inside of a chamber after maintenance of a component within the chamber is conducted; and an etching process of etching a processing target object carried into the chamber after the seasoning process is performed. Here, the seasoning process includes a first process of cleaning the inside of the chamber by supplying an $O_2$ gas into the chamber and generating plasma of the $O_2$ gas within the chamber; and a second process of seasoning, after the first process, the inside of the chamber by supplying a processing gas containing fluorine into the chamber and generating plasma of the processing gas within the chamber.

According to the exemplary embodiments, it is possible to shorten a time required to return the inside of the chamber after maintenance of the inside of the chamber is finished into the state prior to the maintenance.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
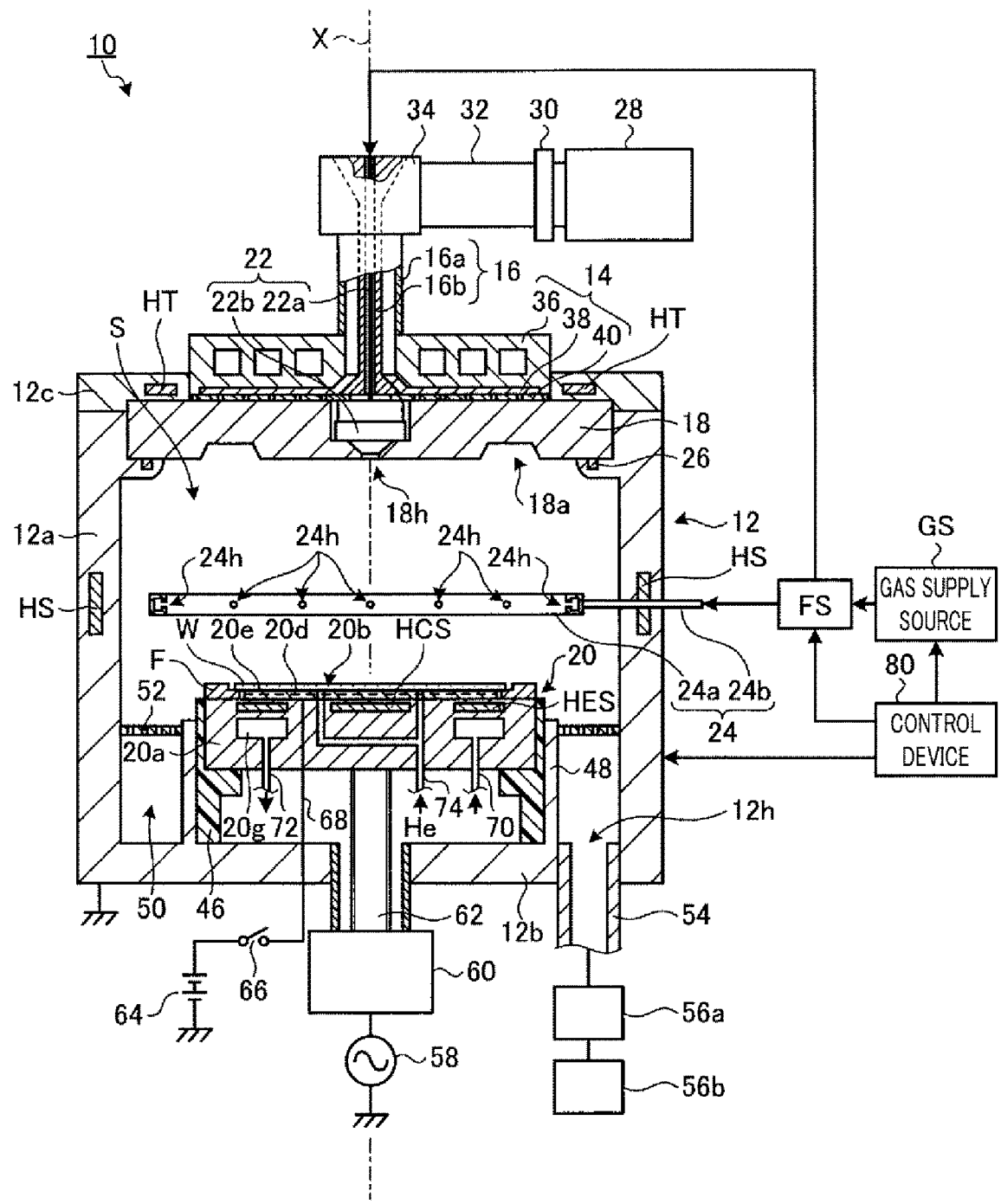
FIG. 1 is a cross sectional view illustrating an example of an etching apparatus.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, a seasoning method and an etching method according to exemplary embodiments will be described in detail with reference to the accompanying drawings, which form a part of the description. However, it should be noted that the exemplary embodiments described herein are not meant to be anyway limiting. Further, the exemplary embodiments can be appropriately combined as long as the contents of processes are not contradictory.

EXEMPLARY EMBODIMENT

[Configuration of Etching Apparatus 10]

FIG. 1 is a cross sectional view illustrating an example of an etching apparatus 10. The etching apparatus 10 according to the present exemplary embodiment is a microwave plasma etching apparatus using a RLSA (Radial Line Slot Antenna), and is used in a process of, e.g., gate processing. The etching apparatus 10 includes, as illustrated in FIG. 1, a chamber 12. In the chamber 12, a processing space S, in which a semiconductor wafer W as an example of a processing target object is placed, is formed. The chamber 12 includes a sidewall 12a, a bottom portion 12b and a ceiling portion 12c.

The sidewall 12a has a substantially cylindrical shape extended in a direction in which an axis line X is extended (hereinafter, referred to as "direction of axis line X"). The bottom portion 12b is located at a lower end side of the sidewall 12a. A gas exhaust opening 12h for gas exhaust is formed at the bottom portion 12b. An upper end of the sidewall 12a is opened. The opening at the upper end of the sidewall 12a is closed by a dielectric window 18. The sidewall 12a, the bottom portion 12b and the ceiling portion 12c are made of a metal such as aluminum, and surfaces of the sidewall 12a, the bottom portion 12b and the ceiling portion 12c are coated with a thermally sprayed film of, e.g., $Y_2O_3$ (yttrium oxide). Further, plasma-resistance treatment is performed on these surfaces. The dielectric window 18 is held between the upper end of the sidewall 12a and the ceiling portion 12c. A sealing member 26 is provided between the dielectric window 18 and the upper end of the sidewall 12a. The sealing member 26 is, by way of non-limiting example, an O-ring and configured to airtightly seal the chamber 12.

The etching apparatus 10 further includes a mounting table 20 provided within the chamber 12. The mounting table 20 is disposed under the dielectric window 18. The mounting table 20 includes a base 20a and an electrostatic chuck 20b.

The base 20a is made of a metallic conductor such as aluminum, and is supported by a supporting member 46 which is vertically extended upwards from the bottom portion 12b. A supporting member 48 made of a conductive material is provided on an outer surface of the supporting member 46. The supporting member 48 is extended vertically upwards from the bottom portion 12b of the chamber 12 along the outer surface of the supporting member 46. An annular gas exhaust path 50 is formed between the supporting member 48 and the sidewall 12a.

An annular baffle plate 52 having a multiple number of through holes is provided at an upper portion of the gas exhaust path 50. The gas exhaust path 50 is connected to a gas exhaust line 54 having the gas exhaust opening 12h. The gas exhaust line 54 is connected to a gas exhaust device 56b via a pressure controller 56a. The gas exhaust device 56b includes a vacuum pump such as a turbo molecular pump. The pressure controller 56a is implemented by a valve configured to adjust a gas exhaust rate, e.g., an APC (Auto Pressure Controller). This pressure controller 56a adjusts an internal pressure of the chamber 12 by adjusting the gas exhaust rate of the gas exhaust device 56b. The processing space S within the chamber 12 is decompressed to a required vacuum level by the pressure controller 56a and the gas exhaust device 56b. Further, a processing gas is exhausted through the gas exhaust path 50 from the peripheral portion of the mounting table 20 by operating the gas exhaust device 56b.

The base 20a serves as a high frequency electrode. The base 20a is connected to a high frequency power supply 58 for RF bias via a matching device 60 and a power feed rod 62. The high frequency power supply 58 is configured to supply a high frequency power having a preset frequency of, e.g., 13.56 MHz suitable for controlling energy of ions attracted into the semiconductor wafer W at a preset power level, so that a high frequency voltage is applied to the base 20a. The matching device 60 is configured to match an impedance of the high frequency power supply 58 and an impedance at a load side such as, mainly, the electrode, the plasma and the chamber 12. The matching device 60 includes a blocking capacitor for self-bias generation.

The electrostatic chuck 20b is provided on a top surface of the base 20a. The top surface of the electrostatic chuck 20b constitutes a mounting region on which the semiconductor wafer W is mounted. The electrostatic chuck 20b is configured to hold the semiconductor wafer W by an electrostatic attracting force. A focus ring F is provided at an outside of the electrostatic chuck 20b in a radial direction thereof to annularly surround the semiconductor wafer W. The electrostatic chuck 20b includes an electrode 20d and an insulating layer 20e made of a dielectric material. The electrode 20d is made of a conductive film such as, but not limited to, Ni or W and is embedded in the insulating layer 20e. The electrode 20d is connected with a DC power supply 64 via a switch 66 and a wiring 68. The electrostatic chuck 20b is configured to attract and hold the semiconductor wafer W on a top surface thereof by a Coulomb force generated by a DC voltage applied from the DC power supply 64.

Annular coolant paths 20g are provided within the base 20a. A coolant of a preset temperature, e.g., cooling water is supplied into and circulated through the coolant paths 20g from a chiller unit via a pipeline 70 and a pipeline 72. A processing temperature of the semiconductor wafer W on the electrostatic chuck 20b can be controlled by adjusting the temperature of the coolant. Further, a heat transfer gas such as, but not limited to, a He gas from a non-illustrated heat transfer gas supply unit is supplied into a gap between a top surface of the electrostatic chuck 20b and a rear surface of the semiconductor wafer W via a gas supply line 74.

The etching apparatus 10 further includes heaters HT, HS, HCS and HES as a temperature control mechanism. The heater HT is embedded in the ceiling portion 12c, and is annularly extended to surround an antenna 14. Further, the heater HS is embedded in the sidewall 12a, and is also annularly extended. For example, the heater HS may be provided at a position corresponding to a midway position of the processing space S in a height direction (i.e., the direction of the axis line X). The heater HCS is embedded in the base 20a. Within the base 20a, the heater HCS is provided in a region under a central portion of the aforementioned mounting region, that is, in a region orthogonal to the axis line X. Further, the heater HES is embedded in the base 20a, and is annularly extended to surround the heater HCS. The heater HES is located under a peripheral portion of the aforementioned mounting region.

The etching apparatus 10 further includes the antenna 14, a coaxial waveguide 16, the dielectric window 18, a microwave generator 28, a tuner 30, a waveguide 32 and a mode converter 34. The microwave generator 28 is connected to an upper portion of the coaxial waveguide 16 via the tuner 30, the waveguide 32 and the mode converter 34. The microwave generator 28 is configured to generate a microwave having a preset frequency of, e.g., 2.45 GHz. The coaxial waveguide 16 is extended along the axis line X which is a central axis thereof. The coaxial waveguide 16 includes an outer conductor 16a and an inner conductor 16b. The outer conductor 16a has a cylindrical shape extended in the direction of the axis line X. A lower end of the outer conductor 16a is connected to an upper portion of a cooling jacket 36 having a conductive surface. The inner conductor 16b is provided within the outer conductor 16a. The inner conductor 16b is extended along the axis line X. A lower end of the inner conductor 16b is connected to a slot plate 40 of the antenna 14.

The antenna 14 is placed within an opening formed at the ceiling portion 12c. The antenna 14 includes a dielectric plate 38 and the slot plate 40. The dielectric plate 38 is configured to shorten a wavelength of a microwave and has a substantially circular plate shape. The dielectric plate 38 is made of, by way of example, but not limitation, quartz or alumina. The dielectric plate 38 is held in place between a top surface of the slot plate 40 and a bottom surface of the cooling jacket 36. That is, the dielectric plate 38, the slot plate 40 and the cooling jacket 36 (substantially, the bottom surface thereof) constitute the antenna 14.

Figure 2:
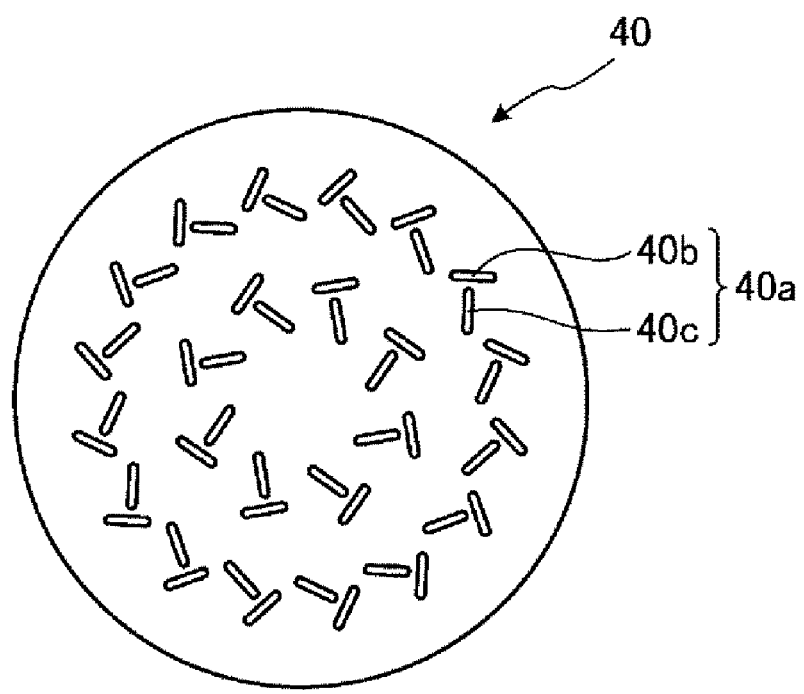
FIG. 2 is a plan view illustrating an example of a slot plate.

The slot plate 40 is a substantially circular metal plate having a multiple number of slot pairs. The antenna 14 is implemented by, for example, a radial line slot antenna. FIG. 2 is a plan view illustrating an example of the slot plate 40. The slot plate 40 is provided with a multiple number of slot pairs 40a, as shown in FIG. 2, for example. The slot pairs 40a are disposed at a regular interval in a radial direction and are arranged at a predetermined interval in a circumferential direction. Each of the multiple number of slot pairs 40a includes two slot holes 40b and 40c. Each of the slot holes 40b and 40c has a narrow long shape. The slot hole 40b and the slot hole 40c are extended such that their axes in a lengthwise direction intersect each other or are orthogonal to each other.

Referring back to FIG. 1, a microwave generated by the microwave generator 28 is propagated to the dielectric plate 38 through the coaxial waveguide 16. Then, the microwave is propagated to the dielectric window 18 from the slot holes 40b and 40c of the slot plate 40, and then, is introduced into the chamber 12.

The dielectric window 18 has a substantially circular plate shape, and is made of, by way of non-limiting example, quartz or alumina. The dielectric window 18 is provided directly under the slot plate 40. The dielectric window 18 is configured to transmit the microwave propagated from the antenna 14 and radiate the microwave into the processing space S from a bottom surface of the dielectric window 18. As a result, an electric field is formed in the processing space S directly under the dielectric window 18, and plasma of a gas within the processing space S is generated. As stated above, in the etching apparatus 10, it is possible to generate the plasma by using the microwave without forming a magnetic field.

In the present exemplary embodiment, a recess 18a is formed on the bottom surface of the dielectric window 18. The recess 18a is annularly formed around the axis line X, and has a tapered shape. The recess 18a is configured to easily generate a standing wave by the microwave propagated to the dielectric window 18 from the antenna 14. Accordingly, the plasma can be efficiently generated within the processing space S by the microwave.

The etching apparatus 10 further includes a central supply unit 22, a peripheral supply unit 24, a flow splitter FS and a gas supply source GS. The central supply unit 22 includes a pipeline 22a and an injector 22b. The pipeline 22a is provided within the inner conductor 16b along the axis line X. One end of the pipeline 22a is connected to the flow splitter FS, and the other end of the pipeline 22a is connected to the injector 22b. The injector 22b is provided with a multiple number of through holes that are extended in the direction of the axis line X. The dielectric window 18 is provided with a space for accommodating the injector 22b therein; and a hole 18h provided along the axis line X to connect the space and the processing space S. The central supply unit 22 is configured to supply a processing gas, which is supplied through the flow splitter FS, into the processing space S through the pipeline 22a, the multiple number of through holes of the injector 22b and the hole 18h along the axis line X from above the processing space S.

The peripheral supply unit 24 includes an annular pipe 24a and a pipeline 24b. The annular pipe 24a is provided within the chamber 12 such that it is annularly extended around the axis line X at a midway position of the processing space S in the direction of the axis line X. The annular pipe 24a is provided with a multiple number of gas discharge holes 24h opened toward the axis line X. The gas discharge holes 24h are annularly arranged around the axis line X. One end of the pipeline 24b is connected to the annular pipe 24a, and the other end of the pipeline 24b is connected to the flow splitter FS which is provided at the outside of the chamber 12. The peripheral supply unit 24 is configured to supply the processing gas into the processing space S toward the axis line X through the pipeline 24b, the annular pipe 24a and the gas discharge holes 24h.

The gas supply source GS is configured to supply the processing gas into the central supply unit 22 and the peripheral supply unit 24 through the flow splitter FS. Specifically, the gas supply source GS supplies an $O_2$ gas, a CF-based gas, a NF-based gas, and so forth into the central supply unit 22 and the peripheral supply unit 24 at preset flow rates. The flow splitter FS is configured to split the processing gas supplied from the gas supply source GS into the central supply unit 22 and the peripheral supply unit 24. With this configuration, a flow rate ratio between the processing gas supplied into the processing space S from the central supply unit 22 and the processing gas supplied into the processing space S from the peripheral supply unit 24 can be spatially controlled in the etching apparatus 10. Furthermore, the central supply unit 22 and the peripheral supply unit 24 may be connected to separate gas supply sources GS individually.

The etching apparatus 10 further includes a control device 80. The control device 80 is implemented by a computer configured to perform a preset process by executing a program read out from a storage device. The control device 80 controls the kind of the processing gas supplied into the flow splitter FS, the flow rate thereof, and so forth by outputting a control signal to the gas supply source GS. Further, the control device 80 controls the flow rate ratio between the processing gas supplied into the central supply unit 22 and the processing gas supplied into the peripheral supply unit 24 by outputting a control signal to the flow splitter FS. Moreover, the control device 80 controls a power of the microwave, a power of the RF bias and an internal pressure of the chamber 12 by outputting control signals to the microwave generator 28, the high frequency power supply 58 and the pressure controller 56a.

[Etching Process]

Figure 3:
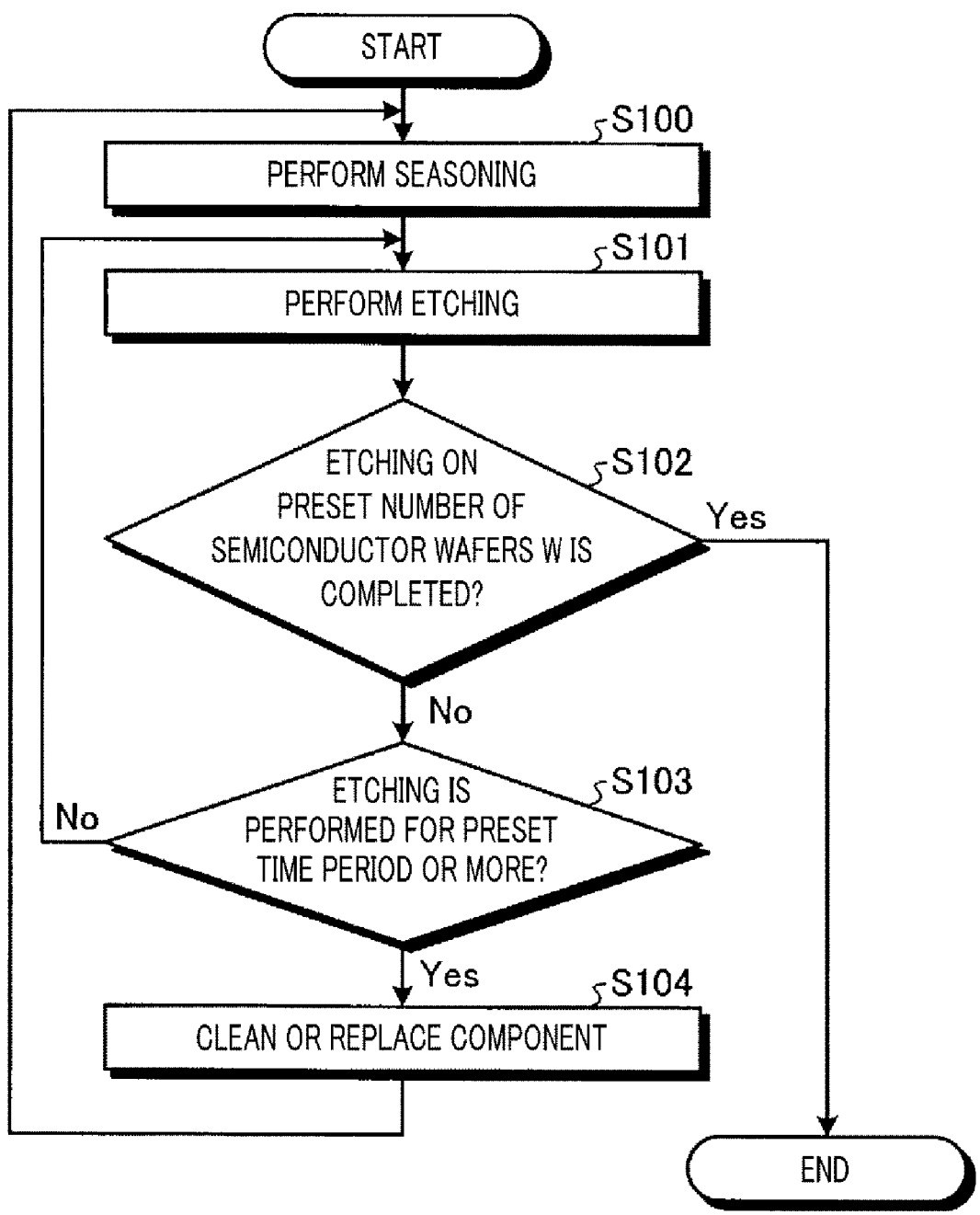
FIG. 3 is a flowchart illustrating an example of an etching process.

In the etching apparatus 10 having the above-described configuration, an etching process is performed on a semiconductor wafer W, which is loaded into the chamber 12, in a sequence described in FIG. 3, for example. FIG. 3 is a flowchart for describing an example of the etching process. The etching process shown in FIG. 3 is an example of an etching method performed by the etching apparatus 10.

First, the control device 80 of the etching apparatus 10 controls individual components of the etching apparatus 10 to perform a seasoning process in which the inside of the chamber 12 is set to a preset environment (S100). Details of the seasoning process will be elaborated later.

After the seasoning process is performed and the inside of the chamber 12 is thus set to the preset environment (atmosphere in which the semiconductor wafer W is processed), the semiconductor wafer W is carried into the chamber 12 and mounted on the electrostatic chuck 20b. Then, the control device 80 controls the individual components of the etching apparatus 10 to perform an etching process in which a preset pattern is formed on the semiconductor wafer W (S101).

In the etching process, an etching gas containing a HBr gas or a Cl gas is supplied from the gas supply source GS into the chamber 12 via the central supply unit 22 and the peripheral supply unit 24. Further, a microwave having a predetermined frequency generated by the microwave generator 28 is radiated into the chamber 12 from the antenna 14, so that plasma of the etching gas is generated within the chamber 12. The semiconductor wafer W on the electrostatic chuck 20b is etched by ions or radicals in the plasma. At this time, a high frequency power having a preset frequency is supplied from the high frequency power supply 58 to the base 20a, so that a bias voltage is applied to the semiconductor wafer W. Upon the completion of the etching process on the semiconductor wafer W, the gas within the chamber 12 is exhausted, and the semiconductor wafer W is carried out from the chamber 12.

Then, the control device 80 determines whether the etching process on a preset number of semiconductor wafers W is completed (S102). If the etching process on the preset number of semiconductor wafers W is completed (S102: Yes), the control device 80 ends the etching process of FIG. 3.

If it is determined that the etching process on the preset number of semiconductor wafers W is not completed (S102: No), on the other hand, the control device 80 determines whether the etching process has been performed for a preset time period or more (S103). If it is found out that the etching process is not performed for the preset time period or more (S103: No), the etching apparatus 10 performs the process S101 again.

Meanwhile, if the etching process is found to be performed for the preset time period or more (S103: Yes), cleaning or replacement of the component within the chamber 12 is performed (S104). Then, the control device 80 performs the process S100 again.

[Seasoning in Comparative Example]

Figure 4:
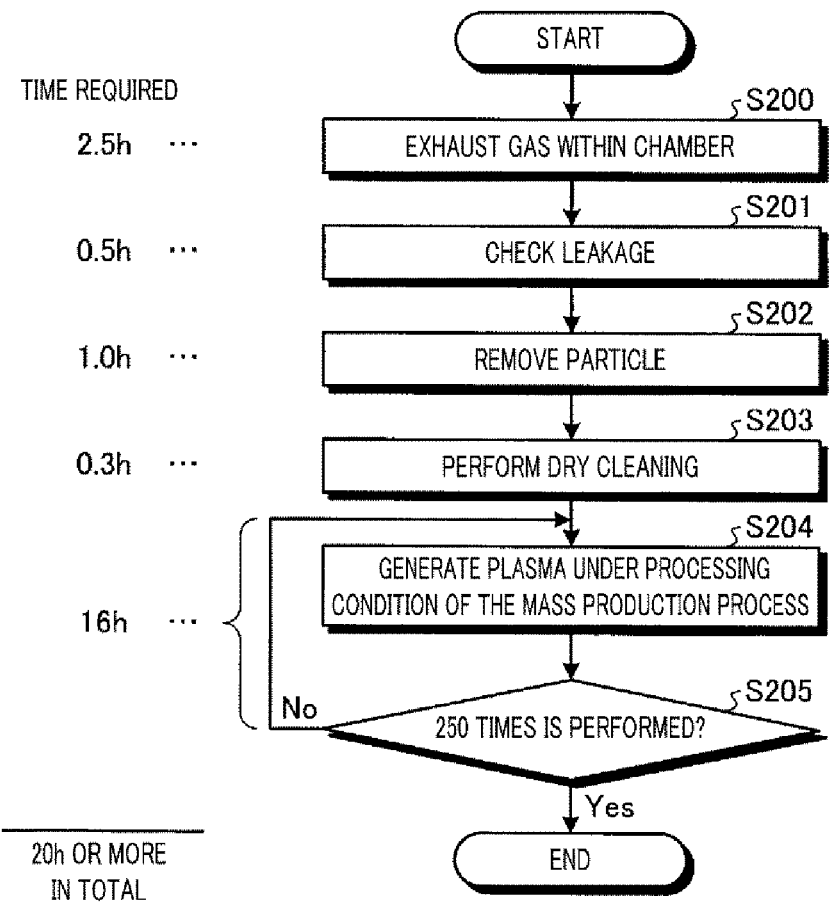
FIG. 4 is a flowchart illustrating an example of a seasoning process in a comparative example.

Now, a seasoning process in a comparative example will be explained. FIG. 4 is a flowchart for describing an example of the seasoning process according to the comparative example.

The control device 80 of the etching apparatus 10 controls the pressure controller 56a and the gas exhaust device 56b to exhaust the gas within the chamber 12 to a preset vacuum level (S200). Then, the control device 80 stops the gas exhaust device 56b and performs a leakage check-up based on a measurement result of the internal pressure of the chamber 12 by a non-illustrated pressure gauge (S201). If the leakage from the chamber 12 is not detected, the control device 80 performs particle removal (S202).

In the process S202, the control device 80 controls the flow splitter FS and the gas supply source GS to supply a preset gas such as a $N_2$ gas into the chamber 12 from the central supply unit 22 and the peripheral supply unit 24. As a result, the internal pressure of the chamber 12 is increased to a preset pressure level. Then, the control device 80 controls the pressure controller 56a and the gas exhaust device 56b to exhaust the gas within the chamber 12. Accordingly, a high-velocity flow of the gas is generated within the chamber 12, so that a particle adhering to the surface of the component within the chamber 12 is removed. In the process S202, it is desirable that the supply of the gas into the chamber 12 and the exhaust of the gas from the chamber 12 are repeated multiple cycles (e.g., 10 cycles). As a method of removing the particle within the chamber 12 by using the gas flow, the NPPC (Non Plasma Particle Cleaning) described in Japanese Patent Laid-open Publication No. 2015-012141 may be used, for example.

Subsequently, the control device 80 performs a dry cleaning process (S203). In the dry cleaning process, the control device 80 controls the flow splitter FS and the gas supply source GS to supply a cleaning gas containing an $O_2$ gas into the chamber 12 through the central supply unit 22 and the peripheral supply unit 24. Further, the control device 80 controls microwave generator 28 to generate a microwave having a preset frequency. The microwave generated from the microwave generator 28 is radiated into the chamber 12 from the antenna 14, so that plasma of the cleaning gas is generated within the chamber 12. Accordingly, moisture within the chamber 12 is removed.

Further, in the dry cleaning process of S203, the high frequency power from the high frequency power supply 58 is not applied to the base 20a. Further, in this dry cleaning process, a dummy wafer of bare silicon wafer is carried into the chamber 12 and mounted on the electrostatic chuck 20b. Accordingly, it is possible to suppress the top surface of the electrostatic chuck 20b from being excessively cleaned.

Then, the control device 80 generates plasma under a processing condition of the mass production process (S204). For example, the processing condition of the mass production process implies an etching condition when performing the gate processing on the semiconductor wafer W as the product. By generating the plasma within the chamber 12 under the processing condition of the mass production process, the environment at the time of performing the etching process on the semiconductor wafer W as the product is created within the chamber 12. Further, the etching process on the semiconductor wafer W as the product includes a plurality of sub-processes. The sub-processes include a process in which a gas containing a HBr gas, a $Cl_2$ gas, or the like but not containing a fluorine-containing gas is used. Further, in the process S204, the high frequency power from the high frequency power supply 58 is not applied to the base 20a. Further, in the process S204, a dummy wafer of bare silicon wafer is carried into the chamber 12 and mounted on the electrostatic chuck 20b.

Subsequently, the control device 80 determines whether the process S204 has been conducted a preset number of times (e.g., 250 times) (S205). The process S204 is a process performed on a single sheet of semiconductor wafer W as a product. Accordingly, if the process S204 is performed 250 times, for example, the environment after 250 sheets of semiconductor wafers W as products are processed is created within the chamber 12. If it is found out that the process S204 is not performed the preset number of times (S205: No), the control device 80 performs the process S204 again. On the other hand, if it is determined that the process S204 has been performed the preset number of times (S205: Yes), the etching apparatus 10 ends the seasoning process depicted in the flowchart of FIG. 4.

[Surface State of Component]

Figure 5:
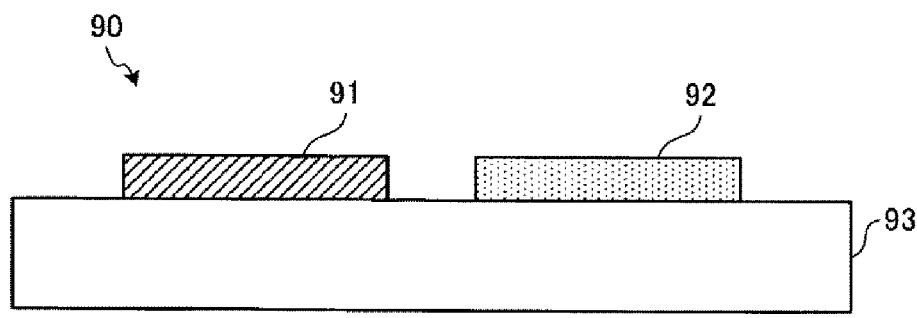
FIG. 5 is a diagram illustrating an example of a sample for measuring a surface state of a component.

Here, a variation in a surface state of each component within the chamber 12 after the seasoning process of the comparative example of FIG. 4 will be discussed. FIG. 5 is a diagram illustrating an example of a sample for measuring the surface state of the component. In an experiment, a sample 90 having, on a silicon substrate 93, a quartz sample 91 and a FC (Fine Ceramics) sample 92 is used, as illustrated in FIG. 5, for example. The FC sample 92 is prepared by thermally spraying yttrium oxide on a surface of aluminum, and a surface of the FC sample 92 is coated with Ir (iridium).

Figure 6:
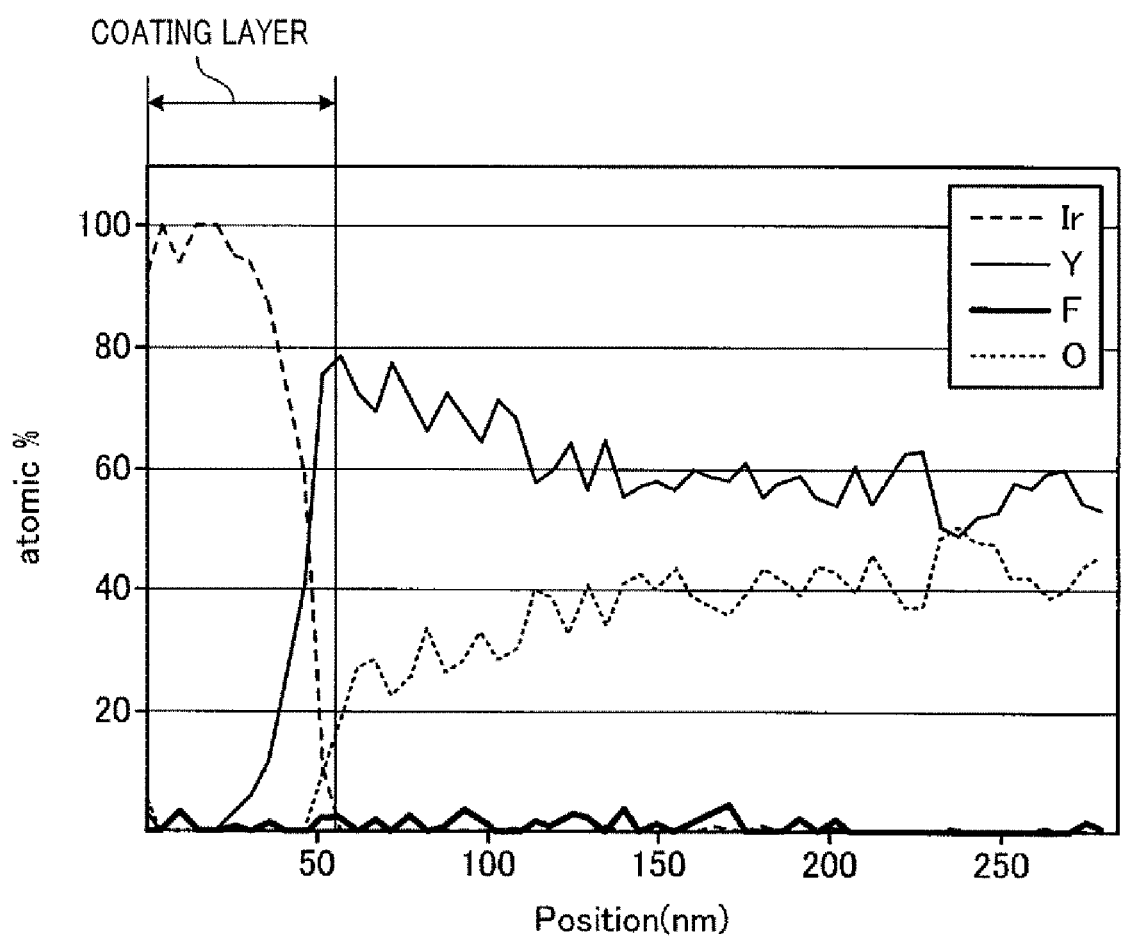
FIG. 6 is a diagram illustrating an example of a measurement result of a surface state of an initial FC sample.
Figure 7:
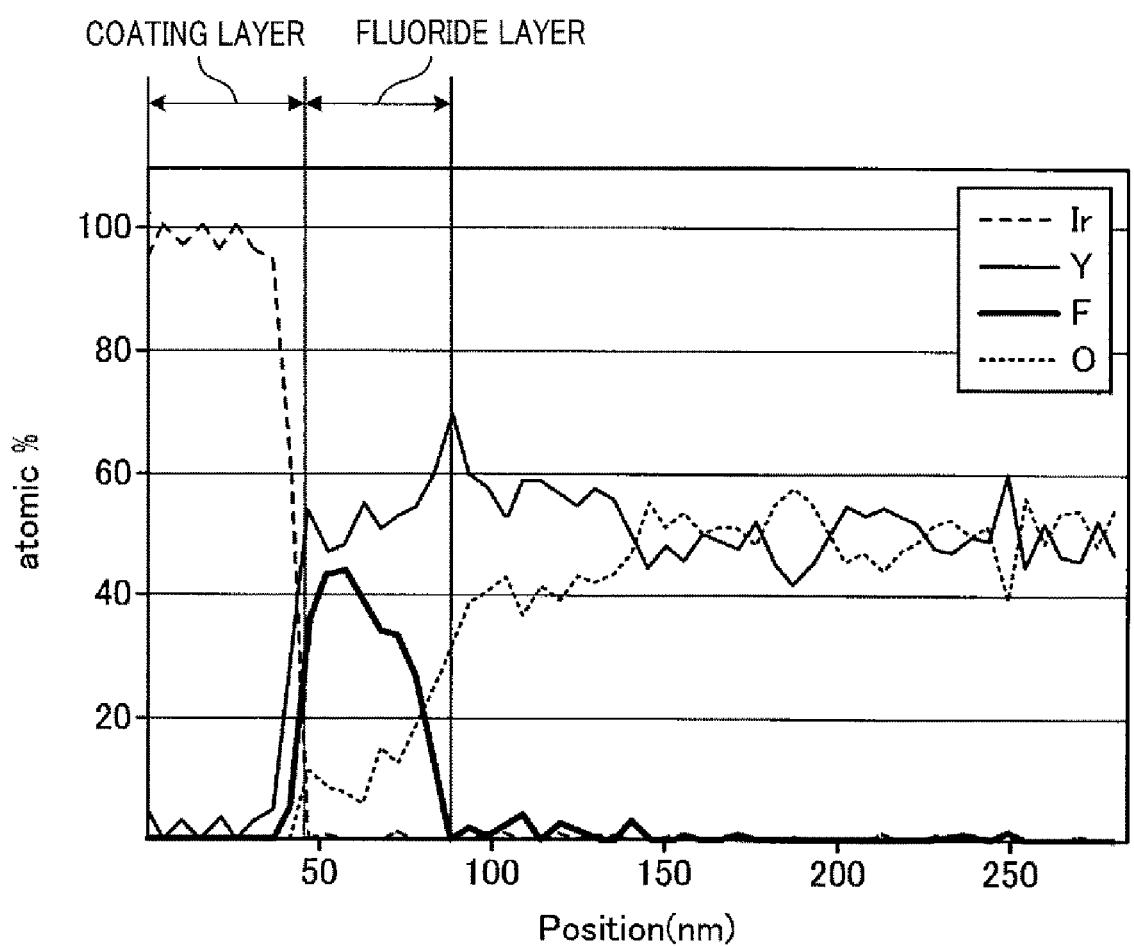
FIG. 7 is a diagram illustrating an example of the measurement result of the surface state of a FC sample on which the seasoning process in the comparative example is performed.

FIG. 6 is a diagram illustrating an example of a measurement result of the surface state of the initial FC sample 92. FIG. 7 is a diagram illustrating an example of a measurement result of the surface state of the FC sample 92 after the seasoning process of the comparative example is performed thereon. In FIG. 6 and FIG. 7, a horizontal axis represents a depth from the surface of the FC sample 92.

A fluorine-containing layer is not detected from the initial FC sample 92, as illustrated in FIG. 6, for example. Meanwhile, in case of the FC sample 92 after the seasoning process of the comparative example shown in FIG. 4 is performed, a fluoride layer having a preset thickness is found to be formed under the coating layer, as illustrated in FIG. 7, for example. Specifically, the fluoride layer having a thickness of about 47 nm is found to be formed on the FC sample 92 after the seasoning process of the comparative example is performed. It is known that if the seasoning process of the comparative example is performed, the environment within the chamber 12 can be returned back into a state close to the state before the maintenance of the component is conducted. For this reason, in the seasoning process, it is desirable that the fluoride layer having a thickness equal to or larger than about 47 nm is formed on the surface of the FC component within the chamber 12.

Here, it takes about 2.5 hours to complete the process S200 shown in FIG. 4; about 0.5 hour, for the process S201; and about 1.0 hour, for the process S202. Further, it takes about 0.3 hour to complete the process S203 shown in FIG. 4, and it takes about 16 hours for the process S204. Therefore, 20 hours or more in total is required for the whole seasoning process of FIG. 4. The seasoning process is performed whenever the maintenance of the component within the chamber 12 is conducted. Thus, in order to improve a throughput of the manufacturing process of the semiconductor device, it is desirable to shorten the time length required for the seasoning process.

Further, a surface roughness (Ra) of the initial FC sample 92 is 0.68 μm, and a surface roughness Ra of the FC sample 92 after the seasoning process of the comparative example is conducted is 2.78 μm. Further, a surface roughness Ra of the initial quartz sample 91 is 0.008 μm, and a surface roughness Ra of the quartz sample 91 after the seasoning process of the comparative example is conducted is 0.022 μm.

[Seasoning Process in Exemplary Embodiment]

Figure 8:
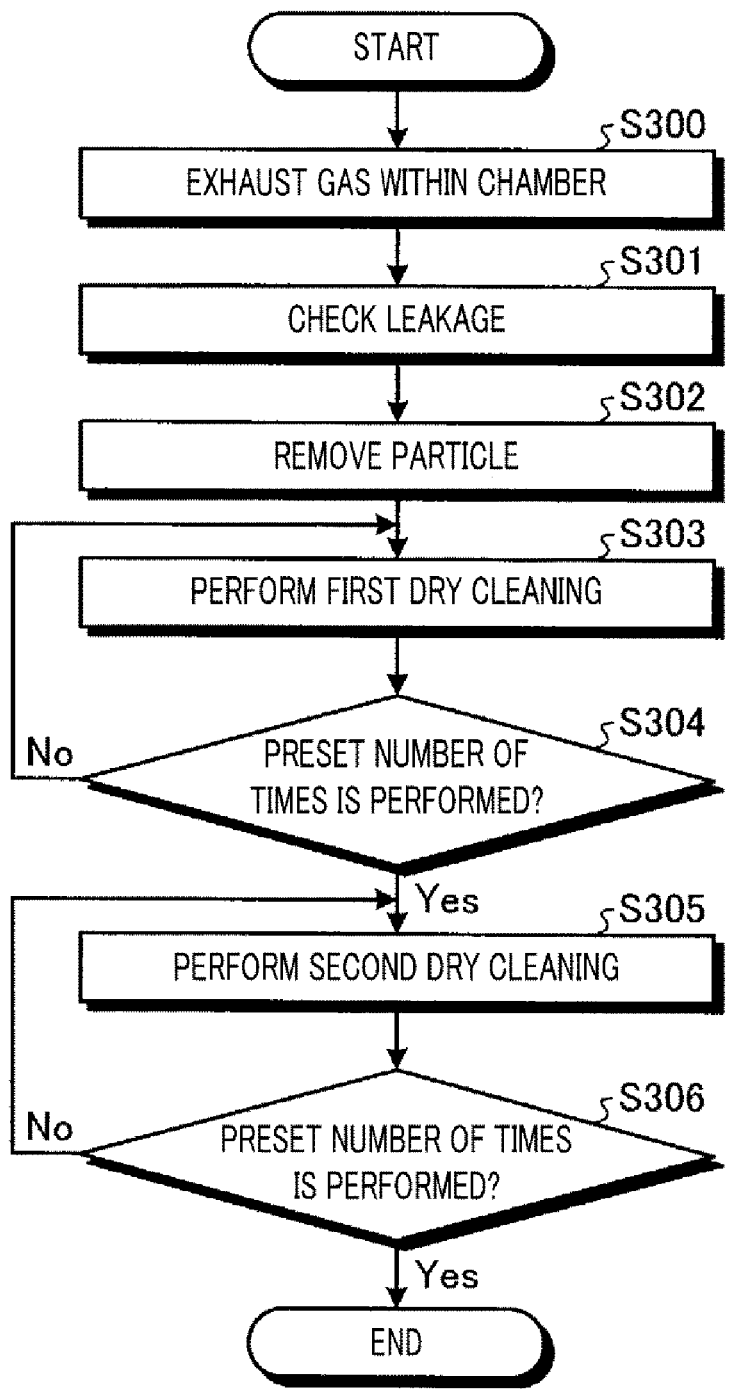
FIG. 8 is a flowchart illustrating an example of a seasoning process according to an exemplary embodiment.

Now, a seasoning process in the exemplary embodiment will be described. FIG. 8 is a flowchart for describing an example of the seasoning process according to the exemplary embodiment. In the seasoning process according to the exemplary embodiment shown in FIG. 8, processes from S300 to S302 are the same as the processes from S200 to S202 of the seasoning process of the comparative example described above with reference to FIG. 4. Thus, redundant description will be omitted herein.

After the particle removal in the process S302 is performed, the control device 80 performs a first dry cleaning process (S303). In the first dry cleaning process, the control device 80 controls the flow splitter FS and the gas supply source GS to supply a cleaning gas containing an $O_2$ gas into the chamber 12 through the central supply unit 22 and the peripheral supply unit 24. As a result, the internal pressure of the chamber 12 is adjusted to a preset pressure level. Further, the control device 80 controls the microwave generator 28 to generate a microwave having a preset frequency. The microwave generated from the microwave generator 28 is radiated into the chamber 12 from the antenna 14, so that plasma of the cleaning gas is generated within the chamber 12. Accordingly, moisture within the chamber 12 is removed. Further, the control device 80 controls the gas supply source GS to stop the supply of the cleaning gas. Further, the control device 80 controls the pressure controller 56a and the gas exhaust device 56b to exhaust the cleaning gas from the chamber 12.

Further, in the first dry cleaning process in the process S303, the high frequency power from the high frequency power supply 58 is not applied to the base 20a. In addition, in this first dry cleaning process, the dummy wafer of bare silicon wafer is carried into the chamber 12 and mounted on the electrostatic chuck 20b. Accordingly, it is possible to suppress the top surface of the electrostatic chuck 20b from being excessively cleaned (damaged).

Subsequently, the control device 80 determines whether the first dry cleaning process has been performed a preset number of times (e.g., 4 times) (S304). In the first dry cleaning process, a time period during which the plasma of the cleaning gas is generated is, for example, about 10 minutes per a single cycle of the first dry cleaning process. Thus, if the first dry cleaning process is performed 4 times, for example, the time period during which the plasma of the cleaning gas is generated within the chamber 12 amounts to about 40 minutes.

Further, if the time period during which the plasma of the cleaning gas is generated within the chamber 12 is equal to or longer than 30 minutes, the first dry cleaning process may be performed 3 times, or 5 or more times. Further, in the first drying cleaning process, the time period during which the plasma of the cleaning gas is generating may be shorter than or longer than 10 minutes per a single cycle of the first dry cleaning process. By way of example, in the first dry cleaning process, assuming that the time period during which the plasma of the cleaning gas is generated is 5 minutes per a single cycle, if the first dry cleaning process is performed 6 times or more, for example, the total time period during which the plasma of the cleaning gas is generated within the chamber 12 amounts to 30 minutes or more.

Further, if the time period during which the plasma is continuously generated is too long, a load on each component of the etching apparatus 10 may be increased. Thus, it is desirable that the time period during which the plasma is continuously generated is shorter than, e.g., 20 minutes. Furthermore, it is desirable to perform the first dry cleaning process two or more times with a process of stopping the supply of the cleaning gas into the chamber 12 and exhausting the inside of the chamber 12 therebetween, rather than performing the first dry cleaning process consecutively for 30 minutes or more. Accordingly, the moisture removed from the inside of the chamber 12 by the plasma of the $O_2$ gas can be discharged to the outside of the chamber 12 efficiently.

If the first dry cleaning process has not been performed a preset number of times (S304: No), the control device 80 performs the process S303 again. If the first dry cleaning process has been performed the preset number of times (S304: Yes), on the other hand, the control device 80 performs a second dry cleaning process (S305).

In the second dry cleaning process, the control device 80 controls the flow splitter FS and the gas supply source GS to supply a processing gas for the seasoning process, which contains a fluorine-containing gas, into the chamber 12 through the central supply unit 22 and the peripheral supply unit 24. As a result, the internal pressure of the chamber 12 is adjusted to a preset pressure level. Further, the control device 80 controls the microwave generator 28 to generate a microwave of a preset frequency. The microwave generated from the microwave generator 28 is radiated into the chamber 12 from the antenna 14, so that plasma of the processing gas for the seasoning process is generated within the chamber 12. Accordingly, the seasoning process of the inside of the chamber 12 is performed. The control device 80 then controls the gas supply source GS to stop the supply of the processing gas for the seasoning process. Further, the control device 80 controls the pressure controller 56a and the gas exhaust device 56b to exhaust the processing gas for the seasoning process from the chamber 12.

Further, in the second dry cleaning process in the process S305, the high frequency power from the high frequency power supply 58 is not applied to the base 20a. Furthermore, in the second dry cleaning process, the dummy wafer is not placed on the electrostatic chuck 20b. Details of conditions for the second dry cleaning process will be elaborated later.

Subsequently, the control device 80 determines whether the second dry cleaning process has been conducted a preset number of times (S306). If it is found out that the second dry cleaning process is not performed the preset number of times (S306: No), the control device 80 performs the process S305 again. If the second dry cleaning process has been performed the preset number of times (S306: Yes), on the other hand, the seasoning process depicted in the flowchart of FIG. 8 is ended.

[First Dry Cleaning Process]

Figure 9:
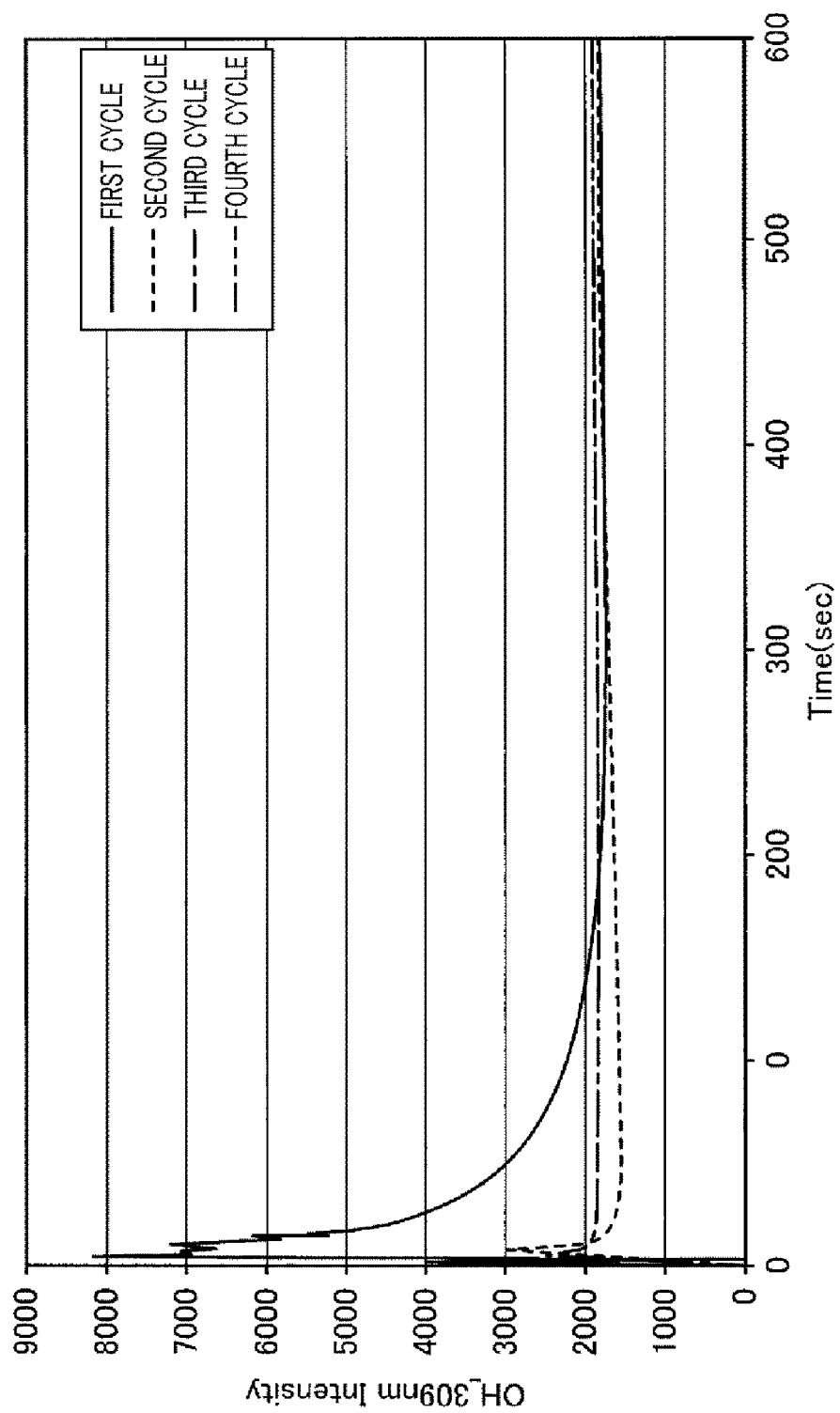
FIG. 9 is a diagram illustrating an example of a measurement result of emission intensity of OH for every cycle of a first dry cleaning process.

Here, the first dry cleaning process of the present exemplary embodiment will be elaborated. FIG. 9 is a diagram illustrating an example of a result of measuring an emission intensity of OH for every cycle of the first dry cleaning process. FIG. 9 shows, in case of performing the first dry cleaning process 4 times, a variation in the emission intensity of OH contained in the plasma generated in each cycle of the first dry cleaning process. The emission intensity of OH is relevant to a moisture amount within the chamber 12. Further, in the first dry cleaning process of the present exemplary embodiment, a time period during which the plasma of the cleaning gas is generated is 10 minutes per the single cycle of the first dry cleaning process.

By way of example, as depicted in FIG. 9, the emission intensity of OH is found to be increased up to about 8000 at maximum in the first cycle of the first dry cleaning process, and the emission intensity of OH is found to be increased up to about 3000 at maximum in the second cycle of the first dry cleaning process. Meanwhile, in the third and fourth cycles of the first dry cleaning process, the emission intensity of OH is found to be about 2500 at maximum.

As can be seen from FIG. 9, the variation in the emission intensity of OH is stabilized if the first dry cleaning process is performed three or more times, that is, if the time period during which the plasma of the cleaning gas is generated in the first dry cleaning process is equal to or longer than 30 minutes. The stabilization of the variation in the emission intensity of OH implies that moisture within the chamber 12 is sufficiently removed. Thus, by generating the plasma of the cleaning gas for 30 minutes or more in the first dry cleaning process, it is possible to remove the moisture within the chamber 12 sufficiently. Furthermore, in consideration of non-uniformity in moisture amounts of the components within the chamber 12, it is desirable to perform the first dry cleaning process 4 times or more, that is, to generate the plasma of the cleaning gas for 40 minutes or more in the first dry cleaning process.

In the present exemplary embodiment, the first dry cleaning process of generating the plasma of the cleaning gas for 10 minutes is performed 4 times, for example. Further, a preset time interval (e.g., about 1 minute) is provided between the individual cycles of the first dry cleaning process. In consideration of a time for preparing the dummy wafer of bare silicon wafer or the like, the time required to perform the first dry cleaning process 4 times is about 50 minutes. Further, regarding processing conditions of the first dry cleaning process, the pressure ranging from 5 mT to 100 mT is desirable, and the pressure ranging from 10 mT to 50 mT is more desirable. Further, regarding the processing conditions of the first dry cleaning process, the flow rate of the $O_2$ gas is desirably in the range from 50 sccm to 1000 sccm, and, more desirably, in the range from 100 sccm to 500 sccm. Further, regarding the processing conditions of the first dry cleaning process, the high frequency power is desirably in the range from 1000 W to 5000 W, and, more desirably, in the range from 2000 W to 4000 W.

[Second Dry Cleaning Process]

Now, the second dry cleaning process shown in FIG. 8 will be elaborated. First, as processing conditions for the second dry cleaning process, the following four kinds of cases (Test 1 to Test 4) are investigated.

TABLE 1

| | Pressure (mT) | MW (W) | Gas (sccm) Ar | Gas (sccm) $NF_3$ | Gas (sccm) $O_2$ | Processing time per single cycle (sec) | Number of repetition |
|---|---|---|---|---|---|---|---|
| Test 1 | 20 | 2000 | — | 40 | 20 | 30 | 25 |
| Test 2 | 20 | 3000 | — | 240 | — | 20 | 50 |
| | 150 | 3000 | — | 240 | — | 20 | |
| Test 3 | 18 | 3000 | — | 300 | 240 | 30 | 25 |
| Test 4 | 30 | 2000 | 600 | 240 | 120 | 30 | 25 |

In the above Table 1, "MW(W)" denotes a power of the microwave radiated into the chamber 12 from the antenna 14. The $NF_3$ gas is an example of the fluorine-containing gas. Further, in Test 2, after the plasma is generated at the pressure of 20 mT within the chamber 12 for 20 seconds, the internal pressure of the chamber 12 is changed into 150 mT, and the plasma is generated at the pressure of 150 mT for 20 seconds.

In Test 1 to Test 4, the process of generating plasma within the chamber 12 under preset conditions is performed preset number of times. A preset time interval (e.g., about 1 minute) is provided between individual cycles of the process. In Test 1, Test 3 and Test 4, a time period during which the plasma is generated in the second dry cleaning process is 30 sec×25 times=12 min 30 sec. Further, in consideration of the time interval between the individual cycles, the processing time of the second dry cleaning process in Test 1, Test 3 and Test 4 amounts to 12 min 30 sec+24 min=about 37 min. Furthermore, in Test 2, a time period during which the plasma is generated in the second dry cleaning process is (20 sec+20 sec)×50 times=33 min 20 sec. Further, in consideration of the time interval between the individual cycles, the processing time of the second dry cleaning process in Test 2 amounts to 33 min 20 sec+49 min=about 83 min.

Figure 10:
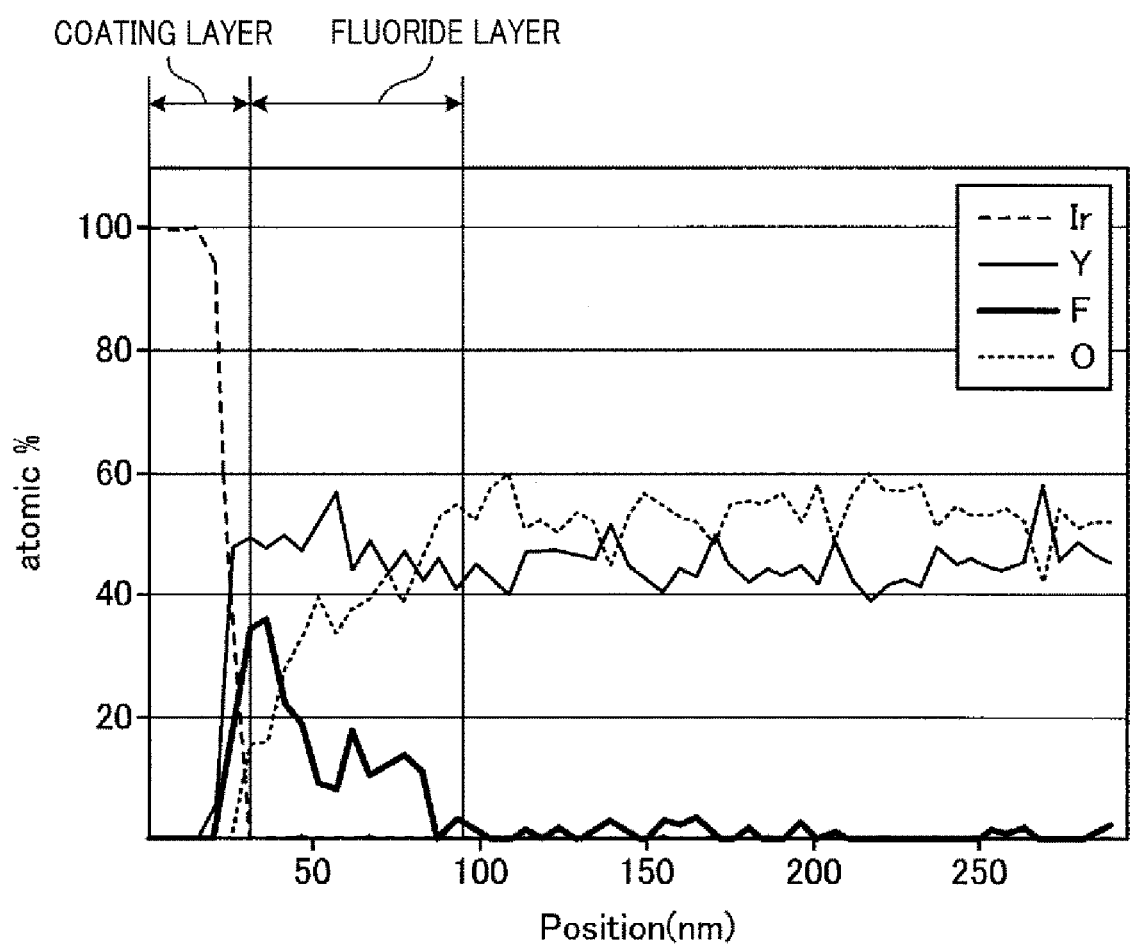
FIG. 10 is a diagram illustrating an example of the measurement result of the surface state of the FC sample on which a second dry cleaning process is performed under the condition of Test 1.
Figure 11:
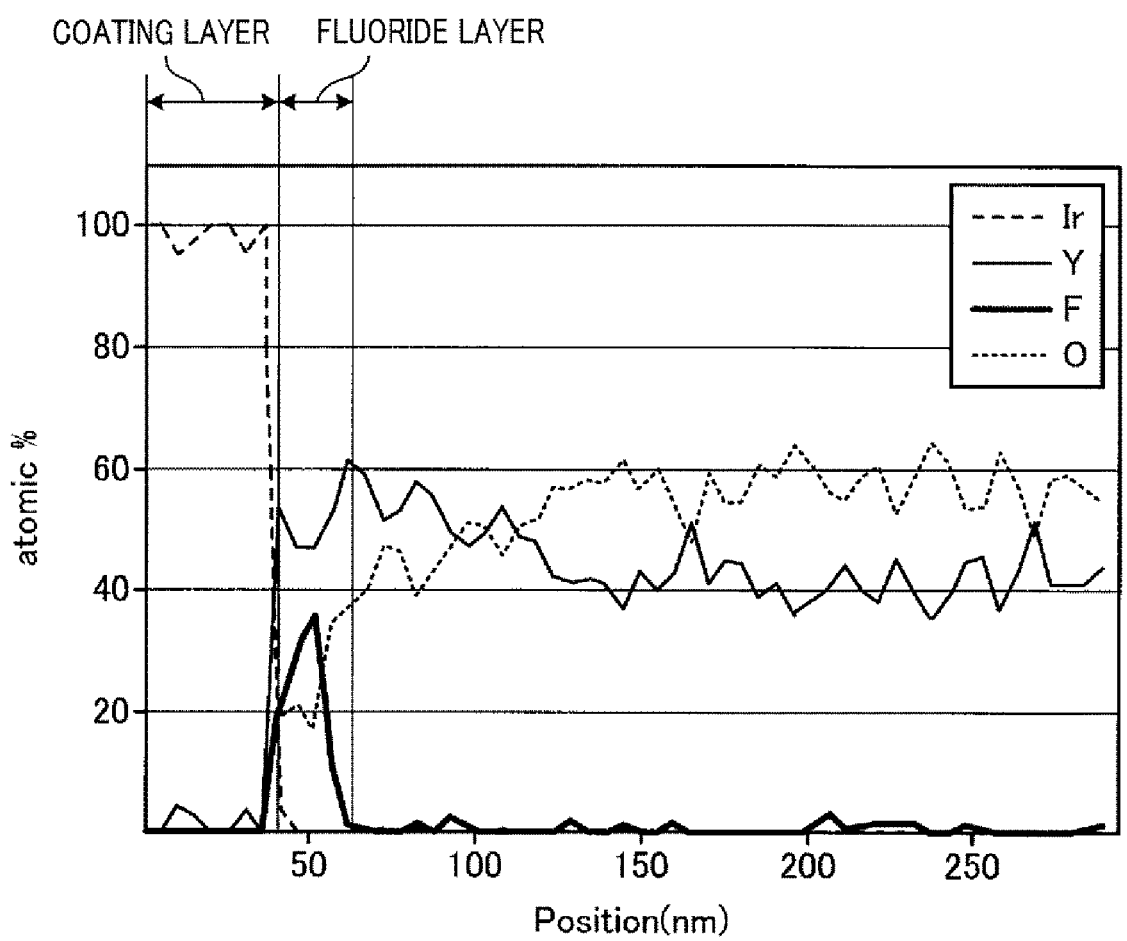
FIG. 11 is a diagram illustrating an example of the measurement result of the surface state of the FC sample on which the second dry cleaning process is performed under the condition of Test 2.
Figure 12:
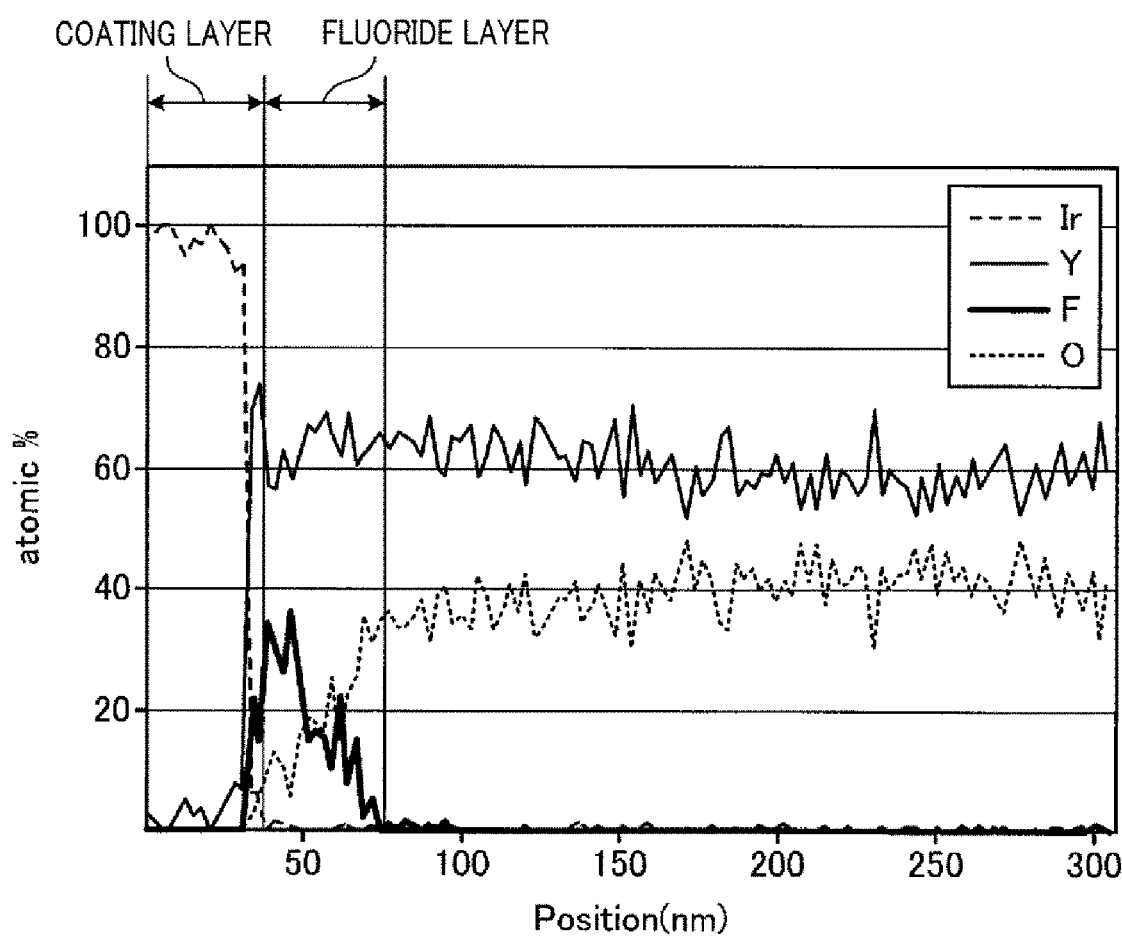
FIG. 12 is a diagram illustrating an example of the measurement result of the surface state of the FC sample on which the second dry cleaning process is performed under the condition of Test 3.
Figure 13:
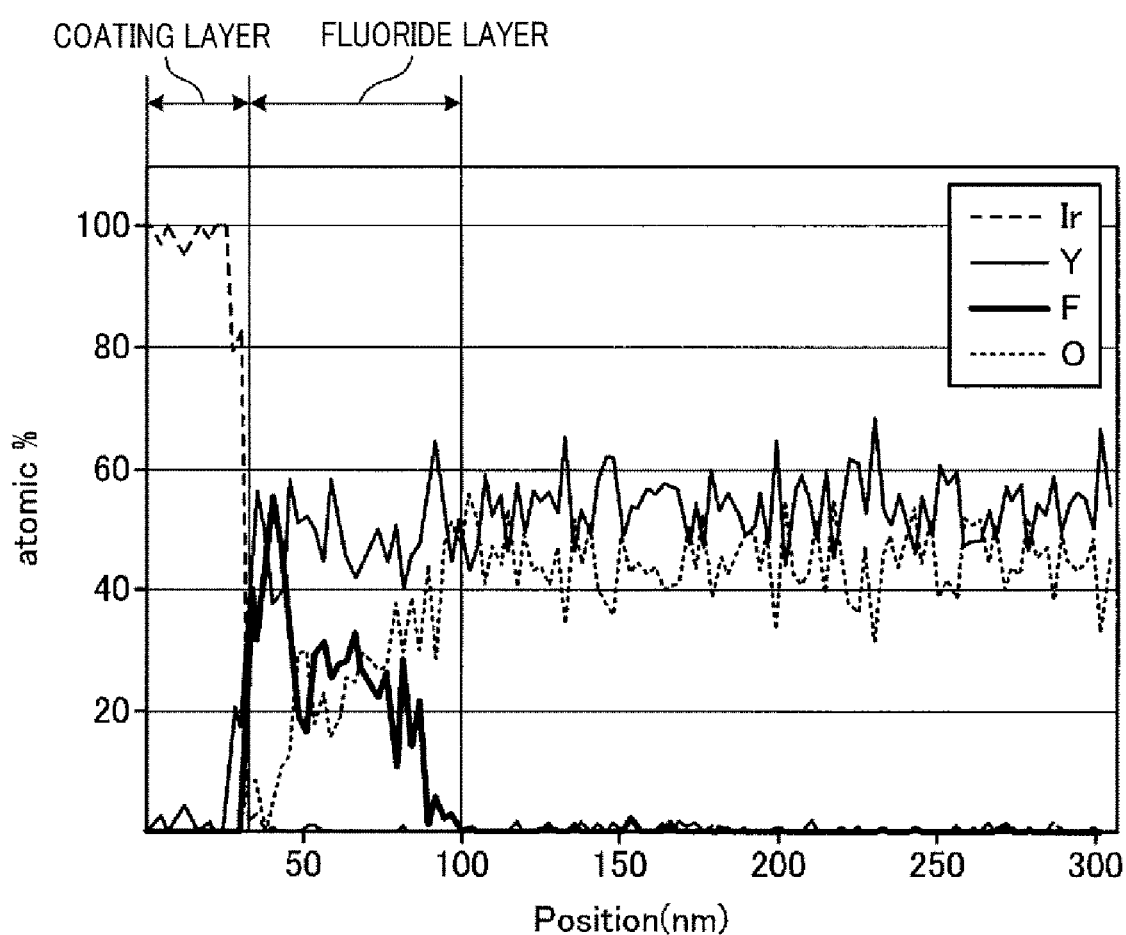
FIG. 13 is a diagram illustrating an example of the measurement result of the surface state of the FC sample on which the second dry cleaning process is performed under the condition of Test 4.

FIG. 10 is a diagram illustrating an example of a measurement result of the surface state of the FC sample 92 after the second dry cleaning process is performed under the condition of Test 1. FIG. 11 is a diagram illustrating an example of the measurement result of the surface state of the FC sample 92 after the second dry cleaning process is performed under the condition of Test 2. FIG. 12 is a diagram illustrating an example of the measurement result of the surface state of the FC sample 92 after the second dry cleaning process is performed under the condition of Test 3. FIG. 13 is a diagram illustrating an example of the measurement result of the surface state of the FC sample 92 after the second dry cleaning process is performed under the conditions of Test 4.

As illustrated in FIG. 10, for example, the fluoride layer having a thickness of about 72 nm is formed on the surface of the FC sample 92 on which the second dry cleaning process has been performed under the condition of Test 1. Further, the surface roughness Ra of the FC sample 92 on which the second dry cleaning process is performed under the condition of Test 1 is found to be 0.5 μm. In addition, the surface roughness Ra of the quartz sample 91 on which the second dry cleaning process is performed under the condition of Test 1 is found to be 0.018 μm.

Further, as shown in FIG. 11, for example, the fluoride layer having a thickness of about 30 nm is formed on the surface of the FC sample 92 on which the second dry cleaning process has been performed under the condition of Test 2. Further, the surface roughness Ra of the FC sample 92 after the second dry cleaning process is performed under the condition of Test 2 is found to be 1.51 μm. In addition, the surface roughness Ra of the quartz sample 91 after the second dry cleaning process is performed under the condition of Test 2 is found to be 0.011 μm.

Furthermore, as depicted in FIG. 12, for example, the fluoride layer having a thickness of about 34 nm is formed on the surface of the FC sample 92 on which the second dry cleaning process has been performed under the condition of Test 3. Further, the surface roughness Ra of the FC sample 92 after the second dry cleaning process is performed under the condition of Test 3 is found to be 1.28 μm. In addition, the surface roughness Ra of the quartz sample 91 after the second dry cleaning process is performed under the condition of Test 3 is found to be 0.0082 µm.

In addition, as illustrated in FIG. 13, for example, the fluoride layer having a thickness of about 59 nm is formed on the surface of the FC sample 92 on which the second dry cleaning process has been performed under the condition of Test 4. Further, the surface roughness Ra of the FC sample 92 after the second dry cleaning process is performed under the condition of Test 4 is found to be 0.35 µm. In addition, the surface roughness Ra of the quartz sample 91 after the second dry cleaning process is performed under the condition of Test 4 is found to be 0.011 µm.

Figure 14:
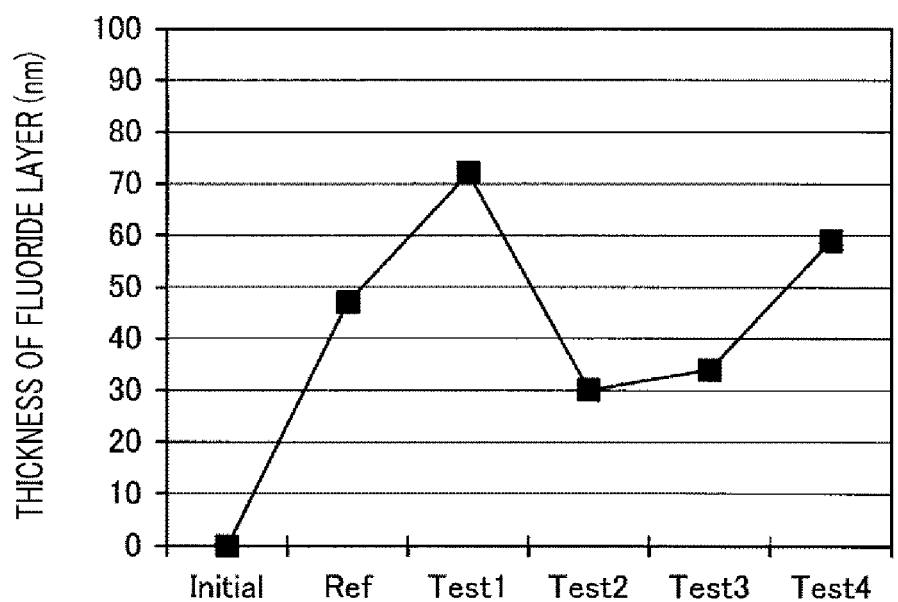
FIG. 14 is a graph showing an example of a thickness of a fluoride layer of the FC sample under each of the conditions.

A comparison of the thicknesses of the fluoride layer formed on the surface of the initial FC sample 92, the fluoride layer formed on the surface of the FC sample 92 on which the seasoning process of the comparative example is performed, and the fluoride layers formed on the surfaces of the FC samples 92 on which the second dry cleaning process is performed under the conditions of Test 1 to Test 4 is provided in FIG. 14, for example. FIG. 14 is a graph illustrating example thicknesses of the fluoride layers of the FC samples 92 under the respective conditions. Further, in FIG. 14, "Initial" indicates the initial FC sample 92 and "Ref" indicates the FC sample 92 on which the seasoning process of the comparative example is performed.

As depicted in FIG. 14, for example, in case of using the conditions of Test 1 and Test 4, the fluoride layers formed on the FC samples 92 on which the second dry cleaning process is performed are found to be thicker than the fluoride layer formed on the FC sample 92 on which the seasoning process of the comparative example is performed.

Figure 15:
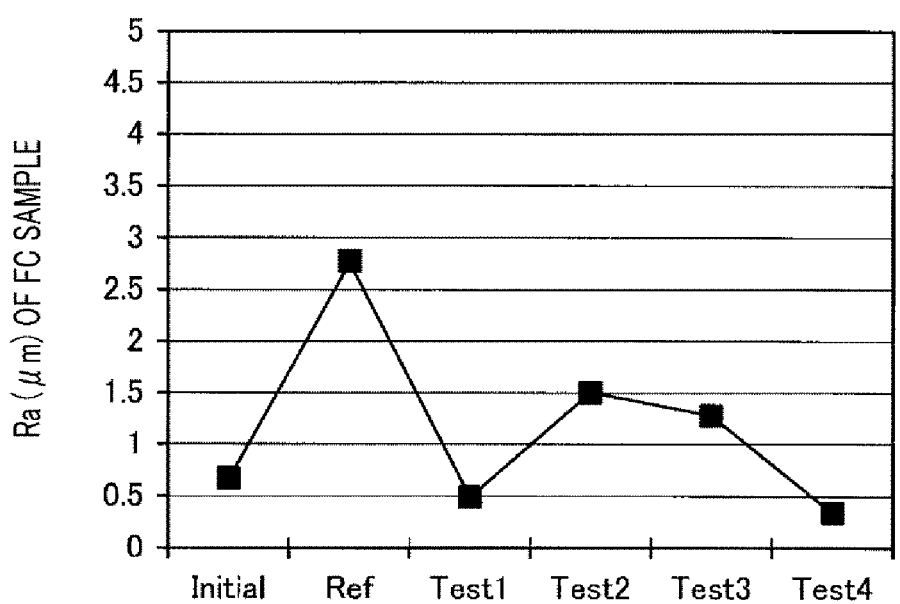
FIG. 15 is a graph showing an example of a surface roughness Ra of the FC sample under each of the conditions.

Further, a comparison of the surface roughness Ra of the initial FC sample 92, the FC sample 92 on which the seasoning process of the comparative example is performed, and the FC samples 92 on which the second dry cleaning process is performed under the conditions of Test 1 to Test 4 is provided in FIG. 15, for example. FIG. 15 is a graph illustrating example surface roughnesses Ra of the FC samples 92 under the respective conditions.

As depicted in FIG. 15, for example, the surface roughnesses Ra of the FC samples 92 on which the second dry cleaning process is performed in Test 1 to Test 4 are all smaller than the surface roughness Ra of the FC sample 92 on which the seasoning process of the comparative example is performed. Especially, in Test 1 and Test 4, the surface roughnesses Ra of the FC samples 92 on which the second dry cleaning process is performed are much smaller than the surface roughness Ra of the FC sample 92 on which the seasoning process of the comparative example is performed. Referring to FIG. 14 and FIG. 15, in view of the thicknesses of the fluoride layers of the FC samples 92 and the surface roughness Ra of the FC samples 92, it is found out that the conditions of Test 1 and Test 4 are desirable as the conditions for the second dry cleaning process.

Figure 16:
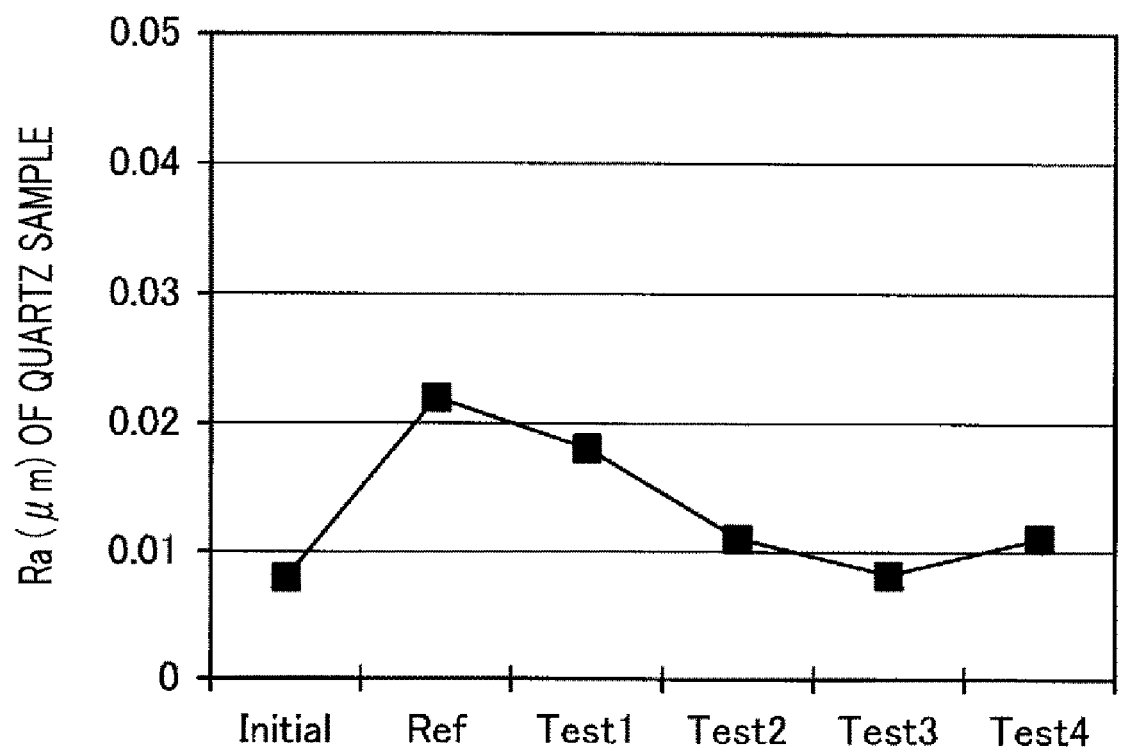
FIG. 16 is a graph showing an example of a surface roughness Ra of quartz sample under each of the conditions.

Furthermore, a comparison of the surface roughness Ra of the initial quartz sample 91, the quartz sample 91 on which the seasoning process of the comparative example is performed, and the quartz samples 91 on which the second dry cleaning process is performed under the conditions of Test 1 to Test 4 is provided in FIG. 16, for example. FIG. 16 is a graph illustrating example surface roughnesses Ra of the quartz samples 91 under the respective conditions.

As shown in FIG. 16, for example, the surface roughness Ra of the quartz sample 91 on which the second dry cleaning process is performed in each of Test 1 to Test 4 is smaller than the surface roughness Ra of the quartz sample 91 on which the seasoning process of the comparative example is performed. In Test 1, however, a deposit generated as the surface of the quartz sample 91 is etched in the second dry cleaning process adheres to the surface of the quartz sample 91 again. Thus, in case of using the condition of Test 1, the surface roughness Ra of the quartz sample 91 after performing the second dry cleaning process is found to be larger than in cases of using the conditions of Test 2 to Test 4. In view of this, based on the surface roughness Ra of the quartz samples 91, it is found out that the conditions of Test 2 to Test 4 are preferable as the condition for the second dry cleaning process, rather than the condition of Test 1.

In view of the measurement results of FIG. 14 to FIG. 16, it is found that the condition of Test 4 is most desirable as the condition for the second dry cleaning process in consideration of the thickness of the fluoride layer of the FC sample 92, the surface roughness Ra of the quartz sample 91, the surface roughness Ra of the FC sample 92, and so forth.

[Evaluation of Etching Characteristics]

Etching characteristics of the etching apparatus 10 after performing the seasoning process of FIG. 8 under the condition of Test 4 for the second dry cleaning process are investigated. Results of etching three sheets of semiconductor wafers W are provided in Table 2. As indexes of the evaluation of the etching characteristics, an etching amount EA and uniformity of a groove formed on the semiconductor wafer W when etching the semiconductor wafer W under the processing condition of the mass production process for 30 seconds are used. Here, the uniformity is a value obtained by measuring a depth of the groove formed on the semiconductor wafer W at a preset number of measurement points and dividing a difference between a maximum measurement value and a minimum measurement value by twice the average value.

TABLE 2

|  | First sheet | Second sheet | Third sheet |
| --- | --- | --- | --- |
| EA (nm/30 sec) | 67.2 | 67.4 | 67.2 |
| Uniformity (range/2ave) | 3.2 | 3.6 | 3.6 |

Referring to Table 2, a standard deviation of the EA is 0.13, and the uniformity is within the range of ±6%. Accordingly, the etching characteristics of the etching apparatus 10 after performing the seasoning process shown in FIG. 8 under the condition of Test 4 for the second dry cleaning process are found to be stabilized with sufficiently little non-uniformity. That is, by performing the seasoning process of FIG. 8 under the condition of Test 4 for the second dry cleaning process, the environment within the chamber 12 can be returned into the state prior to the maintenance.

Here, in the seasoning process of the present exemplary embodiment shown in FIG. 8, the process S300 to the process S302 are the same as the process S200 to the process S202 in the seasoning process of the comparative example, respectively. For the reason, the processing time of about 2.5 hours is required for the process S300; about 0.5 hour, for the process S301; and about 1.0 hour, for the process S302. Further, since the first dry cleaning process of the process S303 in FIG. 8 is performed four times in the present exemplary embodiment, the processing time of about 50 minutes is required to perform the process S303 and the process S304 in FIG. 8. Further, under the condition of Test 4 in the second dry cleaning process of the process S305 in FIG. 8, the processing time of about 40 minutes is required to perform the process S305 and the process S306 in FIG. 8. Accordingly, the processing time required to perform the processes S303 to S306 amounts to about 1.5 hours. Thus, when using the condition of Test 4, the total processing time for the seasoning process of FIG. 8 amounts to about 5.5 hours in the present exemplary embodiment.

As compared to the seasoning process of the comparative example which takes 20 hours or more, about 15 hours can be shortened in the seasoning process according to the present exemplary embodiment. Therefore, a time required to return the environment within the chamber 12 into the state prior to the maintenance after performing the maintenance can be shortened, so that the throughput (operating rate) in the manufacturing process of the semiconductor device can be further improved.

Here, in the seasoning process of the comparative example, it is assumed that by using the plasma of the HBr gas or the Cl gas for use in the mass production process, a reaction product caused by the HBr gas or the Cl gas is generated, and this reaction product adheres to the surface of the component within the chamber 12, so that the environment within the chamber 12 is stabilized. In this regard, the present inventors have assumed that the degree of fluorination of the surface of the component within the chamber 12 is related to the stabilization of the environment within the chamber 12. Further, by conducting experiments, the present inventors have found out that by fluorinating the surface of the component within the chamber 12 with the plasma of the fluorine-containing gas under the condition of Test 4 in the second dry cleaning process, the environment within the chamber 12 can be returned early.

Further, in the seasoning process according to the present exemplary embodiment, the first dry cleaning process with the $O_2$ gas is performed, and, then, the second dry cleaning process with the gas containing fluorine and not containing the HBr gas or the Cl gas is performed. Thus, when the seasoning process of the present exemplary embodiment is completed, no reaction product caused by the HBr gas or the Cl gas adheres to the surface of the component within the chamber 12. Meanwhile, in the seasoning process of the comparative example, since the reaction product caused by the plasma of the HBr gas or the Cl gas in the mass production process adheres to the surface of the component within the chamber 12, the fluorination of the surface of the component within the chamber 12 is hindered. In the seasoning process of the present exemplary embodiment, however, the second dry cleaning process is performed by using the gas containing fluorine and not containing the HBr gas or the Cl gas. Accordingly, the surface of the component within the chamber 12 can be fluorinated rapidly, so that the time required for the seasoning process can be shortened.

Furthermore, in the seasoning process according to the present exemplary embodiment, before performing the second dry cleaning process with the fluorine-containing gas, the first dry cleaning process with the $O_2$ gas is performed for a time period (e.g., 30 minutes or more) longer than the processing time of the second dry cleaning process. Accordingly, the moisture of the component within the chamber 12 can be sufficiently removed, and the environment within the chamber 12 can be stabilized.

[Others]

In Test 4, the pressure within the chamber 12 is set to 30 mT; the power of the microwave, 2000 W; the flow rate of the processing gas $Ar/NF_3/O_2$=600 sccm/240 sccm/120 sccm; the processing time of the single cycle of the second dry cleaning process, 30 sec; and the repetition number of the second dry cleaning process, 25 times. However, the exemplary embodiment is not limited thereto. By way of example, in the second dry cleaning process, the pressure within the chamber 12 may be selected within the range from 5 mT to 250 mT. Further, the power of the microwave in the second dry cleaning process may be selected within the range from 1000 W to 3000 W. Further, the flow rate of the processing gas may be set to be $Ar/NF_3/O_2$=0 sccm~1000 sccm/40 sccm~500 sccm/0 sccm~500 sccm. Furthermore, the processing time during which the plasma is generated within the single cycle of the second dry cleaning process may be set to be shorter or longer than 30 seconds as long as the total time during which the plasma is generated in the second dry cleaning process is equal to or longer than 12 minutes and 30 seconds.

Moreover, in the above-described exemplary embodiment, the microwave plasma etching apparatus using the RLSA is described as an example of the etching apparatus 10. However, the exemplary embodiment is not limited thereto, and the technique of the present exemplary embodiment may be applied to any of various other types of etching apparatuses such as CCP (Capacitively Coupled Plasma) and ICP (Inductively Coupled Plasma) as long as the apparatus is configured to perform the etching process with plasma.

In addition, in the above-described exemplary embodiment, the $NF_3$ gas is used as an example of the fluorine-containing gas. However, the exemplary embodiment is not limited thereto. As the fluorine-containing gas, however, another NF-based gas, a CF-based gas, a SF-based gas may be used. The CF-based gas may be, by way of non-limiting example, a $CF_4$ gas or a $C_4F_6$ gas. Further, the SF-based gas may be, but not limited to, a $SF_6$ gas.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting.

We claim:

1. A seasoning method, comprising:
putting a chamber in a state of a vacuum and then breaking the vacuum of the chamber;
cleaning an inside of the chamber after breaking the vacuum of the chamber;
returning the chamber back into the vacuum;
a first process of cleaning the inside of the chamber by supplying an $O_2$ gas into the chamber and generating plasma of the $O_2$ gas within the chamber and removing a moisture of the component within the chamber; and
after the first process, a second process of seasoning the inside of the chamber by supplying a processing gas containing fluorine into the chamber and generating plasma of the processing gas within the chamber and fluorinating a surface of the component within the chamber,
wherein the first process comprises:
a third process of supplying the $O_2$ gas into the chamber;
a fourth process of generating the plasma of the $O_2$ gas supplied into the chamber; and
a fifth process of stopping the supplying of the $O_2$ gas and exhausting the $O_2$ gas from the chamber,
wherein the third process to the fifth process are repeated two or more times in the first process, and
the processing gas consists of a Ar gas, a $NF_3$ gas and a $O_2$ gas.

2. The seasoning method of claim 1,
wherein a time period during which the plasma of the $O_2$ gas is generated within the chamber in the first process is longer than a time period during which the plasma of the processing gas is generated within the chamber in the second process.

3. The seasoning method of claim 2,
wherein the time period during which the plasma of the $O_2$ gas is generated within the chamber in the first process is equal to or longer than 30 minutes.

4. The seasoning method of claim 1,
wherein the second process comprises:
a sixth process of supplying the processing gas into the chamber;
a seventh process of generating the plasma of the processing gas within the chamber; and
an eighth process of exhausting the processing gas from the chamber, and
wherein the sixth process to the eighth process are repeated two or more times in the second process.

5. The seasoning method of claim 1, further comprising:
a process of supplying a preset gas into the chamber, increasing an internal pressure of the chamber to a preset pressure level and exhausting the preset gas from the chamber prior to the first process.

6. The seasoning method of claim 5,
wherein the supplying of the preset gas into the chamber and the exhausting of the preset gas from the chamber are repeated multiple cycles.

7. The seasoning method of claim 1,
wherein a power for bias is not applied in the first process and the second process.

8. The seasoning method of claim 1,
wherein a time period of a single cycle of the fourth process is shorter than 20 minutes.

9. The seasoning method of claim 8,
wherein the time period during which the plasma of the $O_2$ gas is generated within the chamber in the first process is equal to or longer than 30 minutes.

10. An etching method, comprising:
putting a chamber in a state of a vacuum and then breaking the vacuum of the chamber;
cleaning an inside of the chamber after breaking the vacuum of the chamber;
returning the chamber back into the vacuum;
a seasoning process of seasoning the inside of the chamber after the cleaning of the inside of the chamber;
carrying an etching target wafer into the chamber; and
an etching process of etching the etching target wafer carried into the chamber after the seasoning process is performed,
wherein the seasoning process comprises:
a first process of cleaning an inside of the chamber by supplying an $O_2$ gas into the chamber and generating plasma of the $O_2$ gas within the chamber and removing a moisture of the component within the chamber; and
after the first process, a second process of seasoning the inside of the chamber by supplying a processing gas containing fluorine into the chamber and generating plasma of the processing gas within the chamber and fluorinating a surface of the component within the chamber,
wherein the first process comprises:
a third process of supplying the $O_2$ gas into the chamber;
a fourth process of generating the plasma of the $O_2$ gas supplied into the chamber; and
a fifth process of stopping the supplying of the $O_2$ gas and exhausting the $O_2$ gas from the chamber,
wherein the third process to the fifth process are repeated two or more times in the first process, and
the processing gas consists of a Ar gas, a $NF_3$ gas and a $O_2$ gas.

* * * * *